United States Patent
Takizawa et al.

[11] Patent Number: 6,064,415
[45] Date of Patent: May 16, 2000

[54] THERMAL HEAD AND ITS FABRICATION METHOD

[75] Inventors: Osamu Takizawa; Noriyoshi Shoji, both of Chiba, Japan

[73] Assignee: Seiko Instruments Inc., Japan

[21] Appl. No.: 09/087,191

[22] Filed: May 29, 1998

[30] Foreign Application Priority Data

May 30, 1997 [JP] Japan .................................... 9-142374

[51] Int. Cl.[7] .................................................. B41J 2/335
[52] U.S. Cl. ................................................................ 347/200
[58] Field of Search ...................................... 347/200, 205

[56] References Cited

U.S. PATENT DOCUMENTS

| | | | |
|---|---|---|---|
| 4,873,622 | 10/1989 | Komuro et al. | 346/140 R |
| 5,280,301 | 1/1994 | Ota et al. | 346/76 |
| 5,450,101 | 9/1995 | Ishida et al. | 347/200 |

FOREIGN PATENT DOCUMENTS

| | | |
|---|---|---|
| 286258A2 | 10/1988 | European Pat. Off. . |
| 469916A1 | 2/1992 | European Pat. Off. . |
| 593175A2 | 4/1994 | European Pat. Off. . |
| 607929A2 | 7/1994 | European Pat. Off. . |
| 2145667 | 4/1985 | United Kingdom . |

*Primary Examiner*—Huan Tran
*Attorney, Agent, or Firm*—Adams & Wilks

[57] ABSTRACT

A thermal head comprises an insulative substrate, heat-generating resistor elements mounted on the insulative substrate, a driver IC mounted on the insulative substrate for driving the heat-generating resistor elements, a heat radiating member connected to the insulative substrate for radiating heat generated by the heat-generating resistor elements, and a flexible circuit board for supplying power to the driver IC. The flexible circuit board has conductor layers interposed between insulating layers, a first portion connected to the heat radiating member, and a second bent portion having one of the conductor layers electrically connected to the insulative substrate.

14 Claims, 2 Drawing Sheets

THERMAL HEAD AND ITS FABRICATION METHOD

BACKGROUND OF THE INVENTION

The present invention relates to a thermal head mounted on a facsimile machine, a printer or the like.

As shown by FIG. 1, according to a thermal head, a driver IC 3 for selectively generating heat at a heat generating resistor 2 is mounted on an insulative heat generating resistor substrate 1 where a heat generating register row and electrodes for feeding electricity thereto are formed, and a flexible circuit board 4 is electrically connected to the driver IC 3 for transmitting electric signals for operational control and supplying power source from an external circuit. The connection is generally carried out by electrically connecting the flexible circuit board 4 to electrode terminals of the heat generating resistor substrate 1 by soldering or the like. Further, the heat generating resistor substrate 1 and the flexible circuit board 4 are fixed to a radiating plate 5 for excellently radiating heat generated from the heat generating resistor 2.

FIG. 3 and FIG. 4 show an example of the structure of a conventional thermal head. The heat generating resistor substrate 1 and the flexible circuit board 4 are fixed to the radiating plate 5 by using a double-sided tape or an adhering agent. However, when the radiating plate 5 is provided with a structure having a stepped portion, in the case where the fixing operation is carried out by using a double-sided tape or an adhering agent, it is difficult to paste or coat the tape or the adhering agent uniformly over an entire face of the radiating plate in a single operation. Particularly, in the case of the structure having a stepped portion, an adhesive agent cannot be coated by adopting a printing system. As mentioned above, it is ideal that a face of the radiating plate 5 for fixing the heat generating resistor substrate 1 and the flexible circuit board 4 is a plane flush face having no stepped portion and accordingly, as shown by FIG. 3, a stepped difference between the flexible circuit board 4 and the radiating plate 5 caused by the thickness variation of the heat generating resistor substrate 1, has been dealt with by pasting a thickness substrate 6 in correspondence with the stepped difference to the flexible circuit board 4. However, according to this method, the fabrication cost of the flexible circuit board 4 is significantly increased and, therefore, the method has hardly been adopted.

FIG. 4 shows a structure where the radiating plate 5 is provided with a stepped portion. According to the structure, the radiating plate 5 is provided with the stepped difference and accordingly, when the fixing operation is carried out by using a double-sided tape, an operation of pasting the tape at a portion of the radiating plate for pasting with the heat generating resistor substrate 1 and an operation of pasting the tape at a portion of the radiating plate 5 for pasting with the flexible circuit board 4 must be performed separately. Further, in the case of using an adhering agent, as mentioned above, a printing system cannot be adopted and only a coating system by using a brush or the like or an injection system by using a dispenser or the like can be adopted, and therefore, not only the operation is troublesome but also uniform coating is difficult to perform.

According to the example of FIG. 4, there is provided a method in which in respect of the portion of the flexible circuit board 4 for pasting with the radiating plate 5, a double-sided tape is pasted previously on the side of the flexible circuit board 4. In this case, the cost is not as high as that of the structure where the thickness plate 6 in correspondence with the stepped difference is pasted as described above, however, an increase in the cost is unavoidable also in view of a number of steps of operation where operation of detaching exfoliation paper of the double-sided tape is needed and so on.

Accordingly, in either of examples of FIG. 3 and FIG. 4, factors of increasing the fabrication cost of the thermal head are resulted since the flexible circuit substrate 4 becomes expensive or the step of pasting a double-sided tape or the step of coating an adhesive agent becomes complicated.

SUMMARY OF THE INVENTION

It is an object of the present invention to realize a structure and a fabrication method of a very inexpensive thermal head in which a double-sided tape can be pasted or an adhering agent can be coated on a radiating plate simply and conveniently without using a flexible circuit board or a radiating plate with increased cost.

According to the present invention, a face of a radiating plate for fixing a heat generating resistor substrate and a flexible circuit board is made a flat flush face and the flexible circuit board is fixed to flex onto the radiating plate.

By adopting the structure described above, a substrate for adjusting a stepped difference needs not to be fixed on the flexible circuit board and a double-sided tape needs not to be pasted thereon. Further, the double-sided tape or the adhering agent is coated on a flat face in a single operation.

DETAILED DESCRIPTION OF THE PREFERRED EMBODIMENTS

Figure 1:
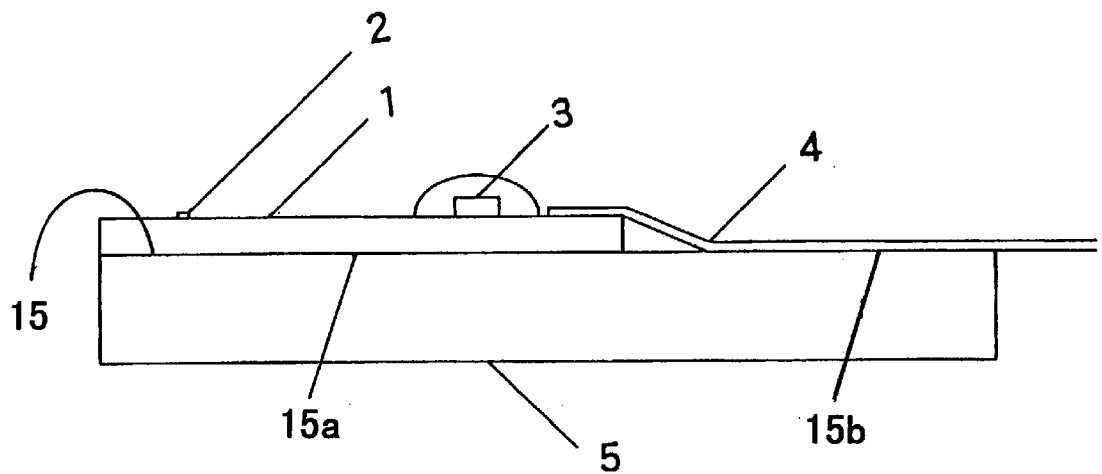
FIG. 1 an outline sectional view of a thermal head according to the present invention.

An explanation will be given of an embodiment of the present invention as follows.

First, an explanation will be given of an example when a double-sided tape is used. A radiating plate 5 has a surface or face 15 to which the heat generating resistor substrate 1 and the flexible circuit board 4 are connected. The heat generating resistor substrate 1 and the flexible circuit board 4 are connected to a first surface portion 15a and a second surface portion 15b, respectively, of the radiating plate 5. The first and second surface portions 15a, 15b are generally flush to each other, and thus the surface 15 is a flush face with no stepped difference. One sheet of a double-sided tape is pasted at a region of the face in conformity with a width for pasting with two of the substrates. In this case, only exfoliating paper of the double-sided tape need to exfoliate and for that purpose, the tape must be pressed to the radiating plate by a force to some degree and therefore, the adhering face is swept by a pressing member or squeezee or the like. At this occasion, according to the conventional structure where the face of the radiating plate is provided with a stepped portion, not only a squeezee having a special shape must be used to press the double-sided tape uniformly over an entire face of the pasted portion but also it has been difficult to adhere the tape to the radiating plate at a stepped portion with no gap.

When an adhesive or adhering agent is used, the adhering agent is coated at a portion of the radiating plate the same as that of the region for the double-sided face. This operation is preferably carried out by the screen printing where the coating can be performed most simply, conveniently and uniformly. As described above, coating by the screen system cannot be carried out in the case of the structure where the face of the radiating plate is provided with a stepped portion, and the screen system is applicable only when the radiating plate is flat.

The heat generating resistor substrate 1 and the flexible circuit board 4 are previously connected to each other by soldering or the like. The heat generating resistor substrate 1 and the flexible circuit board 4 are mounted on the radiating plate 5 by pasting with the double-sided tape as described above, and both of the heat generating resistor substrate 1 and the flexible circuit board 4 are brought into press contact with the radiating plate 5.

Figure 2:
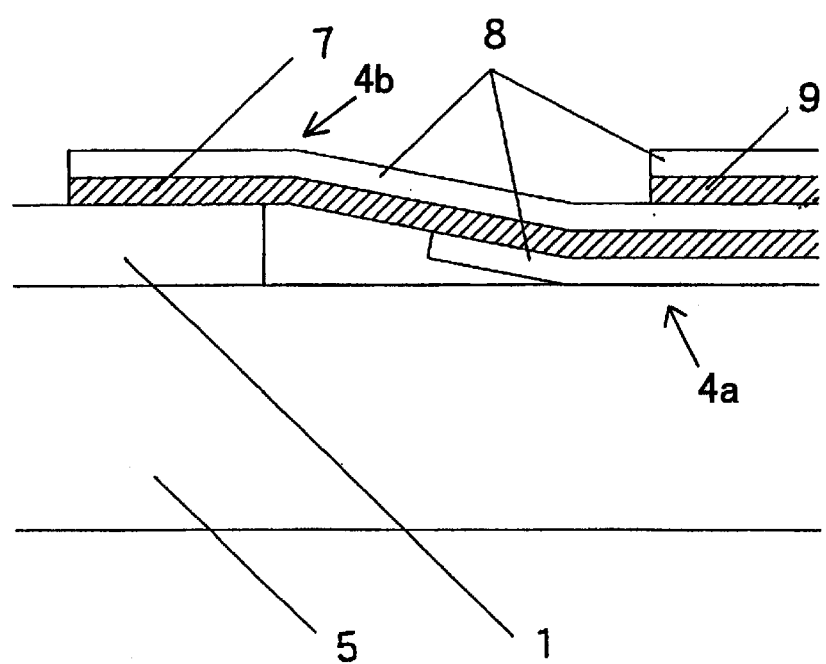
FIG. 2 is a partially-cut sectional view of the thermal head according to the present invention.
Figure 3:
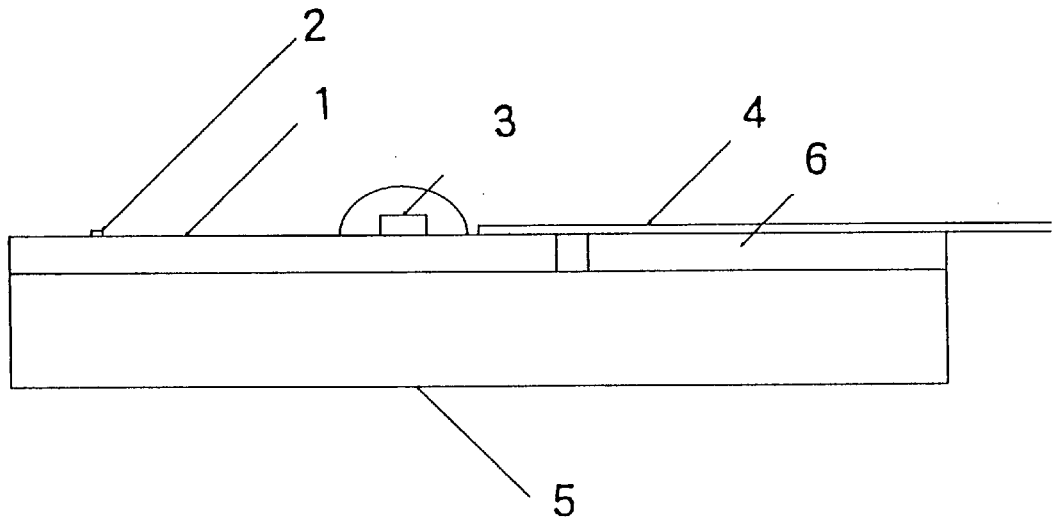
FIG. 3 is a sectional view of a conventional example.

In this case, although the flexible circuit board 4 is bent or flexed as shown by FIG. 1, normally, disconnection of wire or the like does not constitute a problem at all in respect of the flexing of the substrate to such a degree. Meanwhile, the flexibility of the flexed portion can further be promoted by using a flexible circuit board having a structure as shown by FIG. 2. A substrate of double-sided wiring comprising a first conductor layer 7, an insulating layer 8 and a second conductor layer 9 is used normally as a circuit board of a thermal head. The flexible circuit board has a first portion generally designated at 4a connected to the radiating plate 5, and a second portion generally designated 4b connected to the heat generating resistor substrate 1. In this example, the flexed portion 4b is constituted only by the first conductor layer 7. Both of the operational performance and reliability are enhanced by using such a flexible circuit board.

Figure 4:
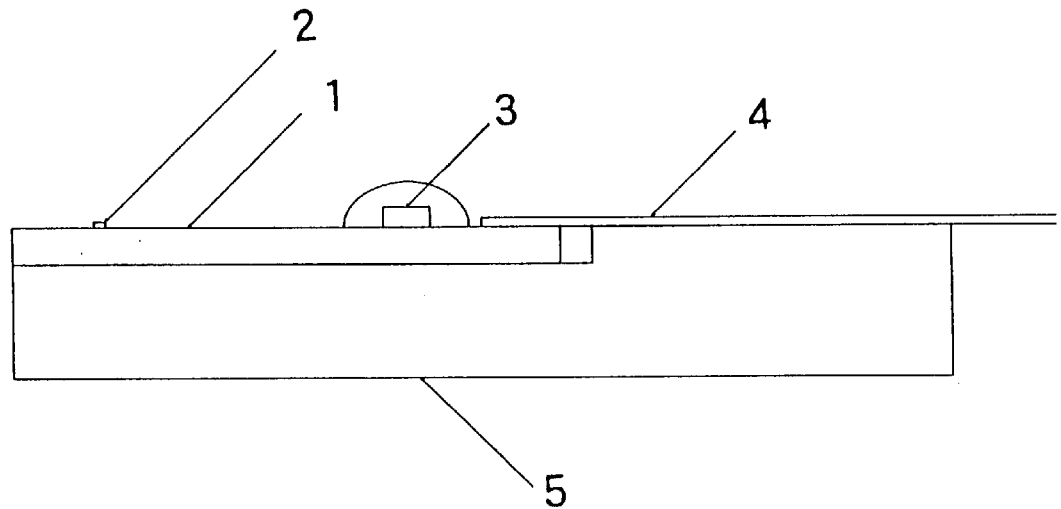
FIG. 4 is a sectional view of a conventional example.

Further, the main stream of material of the conventional radiating plate is an extruded material of metallic aluminum and the fabrication is comparatively facilitated even with a radiating plate having a shape with a stepped portion. However, in recent years, an iron plate which is more inexpensive than aluminum is being used as a material therefor. The iron plate is of a plate shape both faces of which are flat and therefore, when a stepped portion as in the radiating plate 5 of FIG. 4 as mentioned above is added to a portion of the radiating plate 5 for pasting with the flexible circuit board 4, bending is needed. In such a case, even when an inexpensive material is used, the cost is increased and accordingly, it is important that a shape of a radiating plate is of a flat flush face with no stepped difference.

According to the present invention, a double-sided tape can be pasted or an adhering agent can be coated on a radiating plate simply and conveniently, and a flexible circuit board or a radiating plate with increased cost is not required and, therefore, a very inexpensive thermal head can be fabricated.

What is claimed is:

1. A thermal head comprising: a heat generating resistor substrate having a plurality of heat generating resistors and a driver IC for driving the heat; generating resistors to generate heat a heat radiating plate for radiating heat generated by the heat generating resistors, the heat radiating plate having a first surface portion connected to the heat generating resistor substrate and a second surface portion generally flush with the first surface portion; and a flexible circuit board comprised of a plurality of conductor layers interposed between insulating layers for supplying electricity to the driver IC, the flexible circuit board having a first portion connected to the second surface portion of the heat radiating plate and a second bent portion having one of the conductor layers electrically connected to the heat generating resistor substrate.

2. A thermal head according to claim 1; wherein the heat radiating plate comprises an iron plate.

3. A method of fabricating a thermal head comprising the steps of: providing a heat generating resistor substrate having a plurality of heat generating resistors and a driver IC for driving the heat generating resistors to generate heat; providing a heat radiating plate for radiating heat generated by the heat generating resistors, the heat radiating plate having a first surface portion and a second surface portion generally flush with the first surface portion; providing a flexible circuit board comprised of a plurality of conductor layers interposed between insulating layers for supplying electricity to the driver IC; forming an adhering layer on the first and second surface portions of the heat radiating plate; fixing the heat generating resistor substrate to the first surface portion of the heat radiating plate via the adhering layer; electrically connecting one of the conductor layers of the flexible circuit board to the heat generating resistor substrate; and fixing the flexible circuit board to the second surface portion of the heat radiating plate via the adhering layer by flexing the flexible circuit board.

4. A method of fabricating a thermal head according to claim 3; wherein the adhering layer comprises an adhesive agent; and wherein the forming step comprises forming the adhering layer by screen printing.

5. A thermal head comprising: an insulative substrate; heat-generating resistor elements mounted on the insulative substrate; a driver IC mounted on the insulative substrate for driving the heat-generating resistor elements; a heat radiating member connected to the insulative substrate for radiating heat generated by the heat-generating resistor elements; and a flexible circuit board comprised of a plurality of conductor layers interposed between insulating layers for supplying power to the driver IC, the flexible circuit board having a first portion connected to the heat radiating member and a second bent portion having one of the conductor layers electrically connected to the insulative substrate.

6. A thermal head according to claim 5; wherein the heat radiating member has a first surface portion connected to the insulative substrate, and a second surface portion disposed generally flush with the first surface portion and connected to the first portion of the flexible circuit board.

7. A thermal head according to claim 6; further comprising an adhesive layer for connecting the insulative layer to the first surface portion of the heat radiating member and for connecting the first portion of the flexible circuit board to the second surface portion of the heat radiating member.

8. A thermal head according to claim 7; wherein the adhesive layer comprises an adhesive agent.

9. A thermal head according to claim 5; wherein the heat radiating member comprises an iron plate.

10. A method of manufacturing a thermal head, comprising the steps of: providing an insulative substrate having heat-generating resistor elements and a driver IC for driving the heat-generating resistor elements; providing a flexible circuit board comprised of a plurality of conductor layers interposed between insulating layers for supplying power to the driver IC; connecting a heat radiating member to the insulative substrate for radiating heat generated by the heat-generating resistor elements; and connecting the flexible circuit board to the insulative substrate and the heat radiating member by bending the flexible circuit board.

11. A method according to claim 10; wherein the step of connecting the flexible circuit board comprises electrically connecting a first portion of the flexible circuit board having one of the conductor layers to the insulative substrate, and fixing a second portion of the flexible circuit board to the heat radiating member by bending the flexible circuit board.

12. A method according to claim 10; wherein the heat radiating member has a first surface portion and a second surface portion disposed generally flush with the first surface portion; and wherein the step of connecting the flexible circuit board comprises electrically connecting a first portion of the flexible circuit board having one of the conductor layers to the insulative substrate, and fixing a second portion of the flexible circuit board to the second surface portion of the heat radiating member by bending the flexible circuit board.

13. A method according to claim 12; wherein the step of connecting the heat radiating member comprises connecting the insulative substrate to the first surface portion of the heat radiating member through an adhesive layer.

14. A method according to claim 13; wherein the step of connecting the flexible circuit board includes fixing the second portion of the flexible circuit board to the second surface portion of the heat radiating member through the adhesive layer.

* * * * *